(12) United States Patent
Nakazawa

(10) Patent No.: US 7,183,601 B2
(45) Date of Patent: Feb. 27, 2007

(54) SEMICONDUCTOR DEVICE AND METHOD FOR MANUFACTURING THEREOF

(75) Inventor: Keisuke Nakazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 10/865,812

(22) Filed: Jun. 14, 2004

(65) Prior Publication Data

US 2005/0224851 A1     Oct. 13, 2005

(30) Foreign Application Priority Data

Apr. 6, 2004     (JP) ................ 2004-112466

(51) Int. Cl.
*H01L 29/76* (2006.01)

(52) U.S. Cl. ............. 257/295; 257/532; 257/761; 257/763; 438/3; 438/239; 438/686

(58) Field of Classification Search ........... 257/295, 257/532, 761, 763; 438/3, 239, 608, 686
See application file for complete search history.

(56) References Cited

U.S. PATENT DOCUMENTS

| 6,096,434 | A  | * | 8/2000 | Yano et al. ............. 438/3 |
| 6,194,228 | B1 | * | 2/2001 | Fujiki et al. ............ 438/3 |
| 6,351,006 | B1 |   | 2/2002 | Yamakawa et al. |

FOREIGN PATENT DOCUMENTS

| JP | 11-195768   | * | 7/1999 |
| JP | 2000-208725 | * | 7/2000 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

Disclosed in a semiconductor device comprising a semiconductor substrate, and a ferroelectric layer provided above the semiconductor substrate and sandwiched between a lower electrode and an upper electrode, the lower electrode comprising a strontium ruthenate film having a thickness of 2 nm or less.

20 Claims, 5 Drawing Sheets

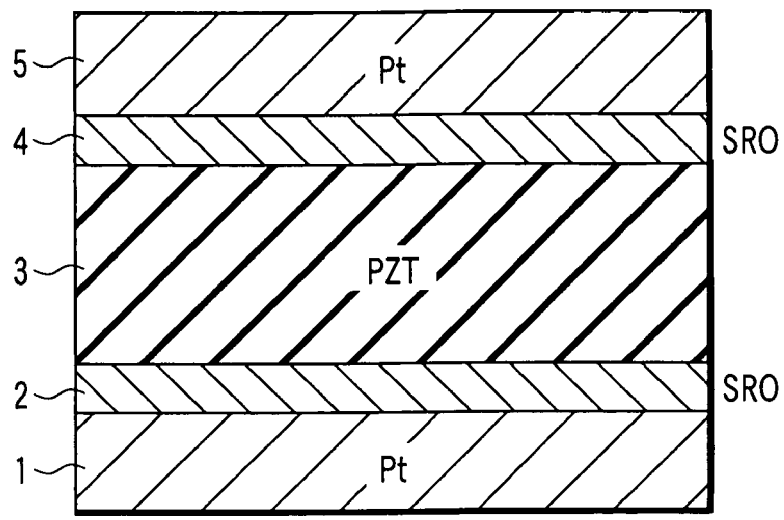
F I G. 1
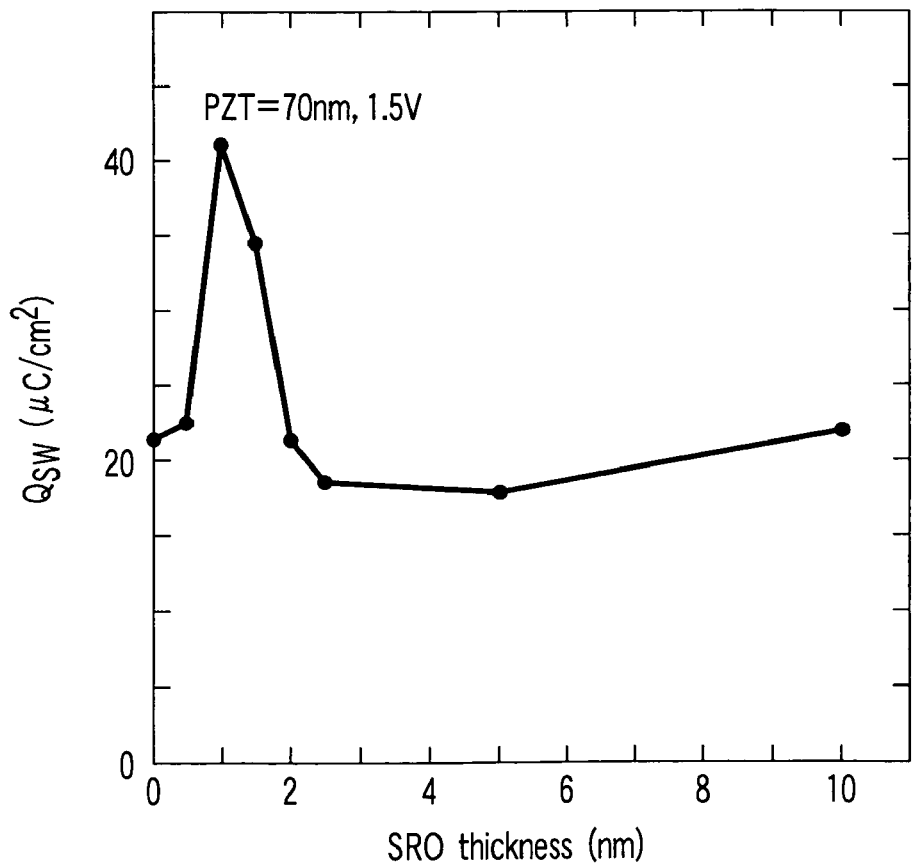
F I G. 2

SEMICONDUCTOR DEVICE AND METHOD FOR MANUFACTURING THEREOF

CROSS-REFERENCE TO RELATED APPLICATIONS

This application is based upon and claims the benefit of priority from prior Japanese Patent Application No. 2004-112466, filed Apr. 6, 2004, the entire contents of which are incorporated herein by reference.

BACKGROUND OF THE INVENTION

1. Field of the Invention

The present invention relates to a semiconductor device and a method of manufacturing the device.

2. Description of the Related Art

A widely popular capacitor of a ferroelectric memory employs the structure that a lead zirconate titanate (Pb$(Zr_xTi_{1-x})O_3$, to be called PZT hereinafter) thin film is sandwiched between a pair of electrodes. When a voltage is applied to this structure, the PZT is polarized. This polarization is not canceled if the power is turned off, and therefore the polarization can serve as a nonvolatile memory. As the polarization amount of the ferroelectric layer becomes larger, the signal amount is increased, and a device with a higher performance can be obtained. Although the PZT has a large polarization amount, the polarization amount is decreases as the cycle of write-in and read-out is repeated when ordinary Pt electrodes are used, (which is called fatigue characteristics).

The drawback of the decrease in the polarization amount of PZT can be avoided by using an electrode made of an electroconductive oxide, and conventionally, the use of, for example, strontium ruthenate ($SrRuO_3$, to be called SRO hereinafter) has been proposed. A typical electrode made of SRO has a thickness of about 10 nm. In the case of the capacitor having a structure in which a PZT thin film is sandwiched between SRO electrodes, the decrease in the polarization amount (fatigue) does not develop even after $10^{15}$ times or more of rewrite. As compared to the case of the capacitor that employs the Pt electrodes, in which the fatigue develops after about $10^6$ times of rewrite, the advantageous effect of the SRO electrodes is remarkable.

However, in the light of the current circumstances, the polarization amount obtained by the capacitor having a conventional structure in which a PZT thin film is sandwiched between SRO electrodes, is still not enough and there is an increasing demand for a further improvement in the polarization amount.

BRIEF SUMMARY OF THE INVENTION

A semiconductor device according to one aspect of the present invention comprises a semiconductor substrate; and a ferroelectric layer provided above the semiconductor substrate and sandwiched between a lower electrode and an upper electrode, the lower electrode comprising a strontium ruthenate film having a thickness of 2 nm or less.

A method of manufacturing a semiconductor device according to one aspect of the present invention comprises forming an amorphous strontium ruthenate film having a thickness of 2 nm or less above a semiconductor substrate; forming a lower electrode by crystallizing the amorphous strontium ruthenate film by a heat treatment; forming a ferroelectric layer above the lower electrode; and forming an upper electrode above the ferroelectric layer.

BRIEF DESCRIPTION OF THE SEVERAL VIEWS OF THE DRAWING

FIG. 1 is a cross sectional view showing the structure of a capacitor according to an embodiment;

FIG. 2 is a graph illustrating the relationship between the thickness of a lower SRO film and the polarization amount of PZT;

DETAILED DESCRIPTION OF THE INVENTION

Figure 3:
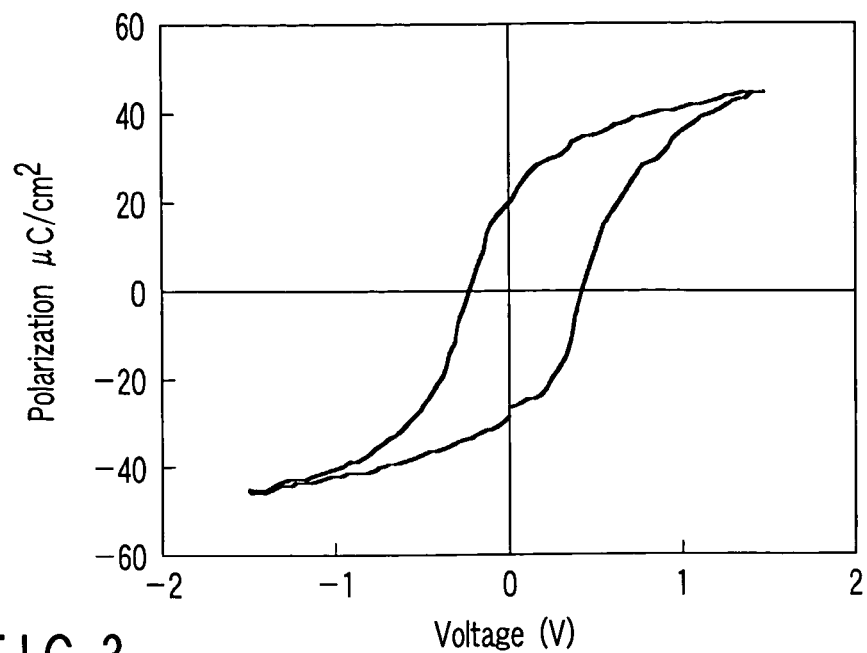
FIG. 3 is a graph illustrating the hysteresis characteristics of a sample according to the embodiment.

An embodiment of the present invention will now be described with reference to accompanying drawings.

The inventor of the present invention discovered that when a PZT film is formed on a conventional lower SRO electrode, PZT is randomly oriented. The inventor further found that the cause that a sufficient polarization amount cannot be obtained in the conventional capacitor resides in the random orientation of PZT. Under the circumstances, the invention carried out intensive studies focusing on the orientation of PZT and has found that PZT can be made to have a desired orientation, more specifically, a priority orientation of (111) by setting the thickness of the lower SRO film to 2 nm or less. Based on this finding, the present invention has been achieved.

FIG. 1 is a schematic diagram showing the layer structure of a semiconductor device according to an embodiment of the present invention. The semiconductor device shown in this figure is a capacitor that employs electrodes including SRO film and a PZT thin film serving as a ferroelectric film, and it was manufactured by the following method.

That is, first, a lower Pt film 1 (100 nm) was formed via a Ti seed layer (not shown) on a semiconductor substrate (not shown) by a DC (direct current) magnetron sputtering method.

On the resultant, an SRO film was formed in the following manner. That is, first, an amorphous SRO film was formed at room temperature by the DC magnetron sputtering method. Using a target that has the same composition as that of the SRO film to be formed, an amorphous SRO film was formed at a low power of about 200 to 400 W in an Ar gas atmosphere. Here, a plurality of samples were manufactured to have various thicknesses of amorphous SRO films ranged between 0.5 nm and 10 nm, which were obtained by varying the sputtering time. The sample having a thickness of the amorphous SRO film of 10 nm is equivalent to the conventional SRO electrode.

Each of the samples was subjected to rapid thermal annealing (RTA) at a temperature of 600° C. for 30 seconds in an oxygen gas flow, to crystallize the SRO film formed on the lower Pt film 1. It should be noted here that when the Ru amount in the amorphous SRO film was made excessive by about 2 to 3%, the crystallization proceeded easily. In this manner, a lower SRO film 2 was formed, and the lower Pt film 1 and the lower SRO film 2 constitute a lower electrode (SRO/Pt electrode).

Then, a PZT film 3 serving as a ferroelectric layer was formed on the lower electrode in the following manner. That is, first, an amorphous PZT film was formed by an RF (radio frequency) magnetron sputtering method. For the formation of the amorphous PZT film, a PZT ceramic target whose Pb amount was increased by about 10% was used. The composition of the target was $Pb_{1.1}Zr_{0.3}Ti_{0.7}O_3$. In order to increase the sputtering rate and the resistance to moisture, the density of the PZT ceramic target should preferably be as high as possible. For this reason, a ceramic sintered body having a theoretical density of 98% was used.

During sputtering, the temperature of the substrate is increased due to plasma and bombardments by sputtering particles occurs, and therefore the evaporation of Pb or loss of Pb in the film caused by re-sputtering easily takes place. The excessive amount of Pb added to the target was the compensation for that. On the other hand, the other elements than Pb, such as Zr and Ti, are taken into the film at substantially an equal ratio to that of the target composition, and therefore these elements need not be added excessively as in the case of Pb.

The sputtering carried out here was an RF magnetron sputtering under a high vacuum, at a power of 1.5 kW and an Ar gas flow of 10 sccm for 32 seconds, and thus a PZT film having a thickness of 35 nm was formed. Before the formation of the PZT film, a pre-sputtering was carried out for about 10 minutes under conditions similar to those of the above-mentioned sputtering conditions in order to make the state and temperature of the surface of the target, as well as the environment within the chamber constant. It should be noted that the Pb amount in the PZT film, the structure and electrical characteristics of the PZT film after the crystallization significantly vary depending on the pre-sputtering.

After forming the amorphous PZT film by the sputtering, the film was subjected to RTA in which the film was heated at 600° C. for 30 seconds in an oxygen gas flow, and thus the amorphous PZT film was crystallized. The just-described step of formation of the amorphous PZT film and crystallization was repeated two times and thus a PZT film 3 having a thickness of 70 nm was formed.

Then, an upper SRO film 4 that gives rise to a part of the upper electrode was formed to have a thickness of 10 nm on the PZT film 3. The upper SRO film can be formed basically the same method as that of the case of the lower SRO film 2. More specifically, first, using an SRO target, an amorphous SRO film was formed by the DC magnetron sputtering method at room temperature. The sputtering was carried out at a low power of about 200 to 400 W in an Ar atmosphere.

Next, an upper Pt film 5 was formed on the SRO film 4. The film formation conditions were similar to those of the case of the lower Pt film 1. Thus the upper Pt film 5 having a thickness of 50 nm was obtained by the DC magnetron sputtering method. Thus obtained film was subjected to RTA under the conditions of 600° C., 30 seconds and oxygen flow, and amorphous SRO on PZT was crystallized. It should be noted here that the amorphous SRO on PZT may be subjected to RTA for crystallization before forming the upper Pt film.

Here, it is possible to replace the upper SRO film 4 with an $IrO_2$ film, $RuO_2$ film or the like. The film type may be decided appropriately in accordance with the characteristics of the device, the advantages in the manufacturing process, etc., and it is not particularly limited. In some cases, it is possible to form the upper electrode only of an SRO film without forming a Pt film.

The Pt film provided as a part of the upper electrode or the lower electrode may be replaced by a conductive material that is conventionally employed as a material for an electrode. More specifically, Ir, Ru, TiN, W, TaN, silicide or the like can be used.

Lastly, each resultant was subjected to recovery annealing under the following conditions: a temperature of 600° C. for 1 hour in an electric furnace, and thus the sample was obtained for each case.

For reference, another sample was manufactured by the same procedure as described above expect that the lower SRO film was not provided, and the polarization amount Qsw of PZT of this reference sample was examined at a measuring voltage of 1.5V. The results of this examination were illustrated in the graph shown in FIG. 2 as a function of the thickness of the lower SRO film 2. As can be seen in FIG. 2, when the thickness of the lower SRO film was 0 nm (that is, when there was no low SRO film) or it exceeded 2 nm, Qsw was as lower as about 20 $\mu C/cm^2$.

Figure 4:
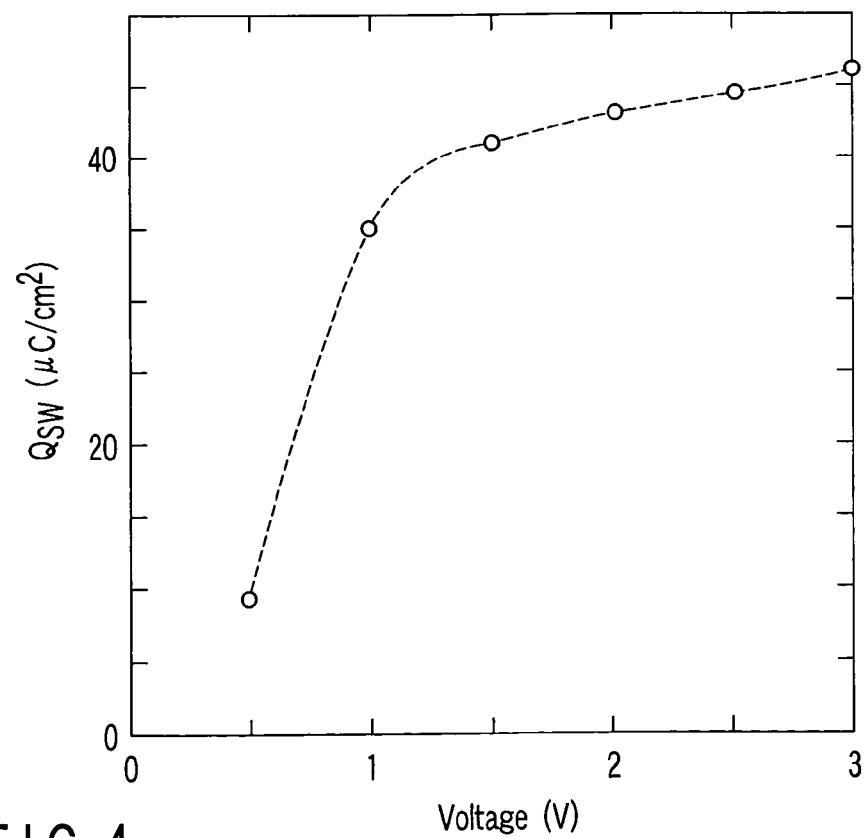
FIG. 4 is a graph illustrating the saturation characteristics of the sample according to the embodiment.

On the other hand, as can be understood from FIG. 2, when the thickness of the lower SRO film was 1 nm, Qsw was sufficiently high as 41 $\mu C/cm^2$. Therefore, this sample was measured in terms of the ferroelectric hysteresis characteristics at 1.5V, and the results were illustrated in FIG. 3. As shown in the figure, an excellent hysteresis curve was obtained. Further, the sample was measured in terms of saturation curve, and the result indicated that the sample was saturated at about 1.5V as shown in FIG. 4. From these results, it is suggested that the sample of this embodiment can be used as a ferroelectric memory that operates at a low voltage of 1.5V or lower.

Figure 5:
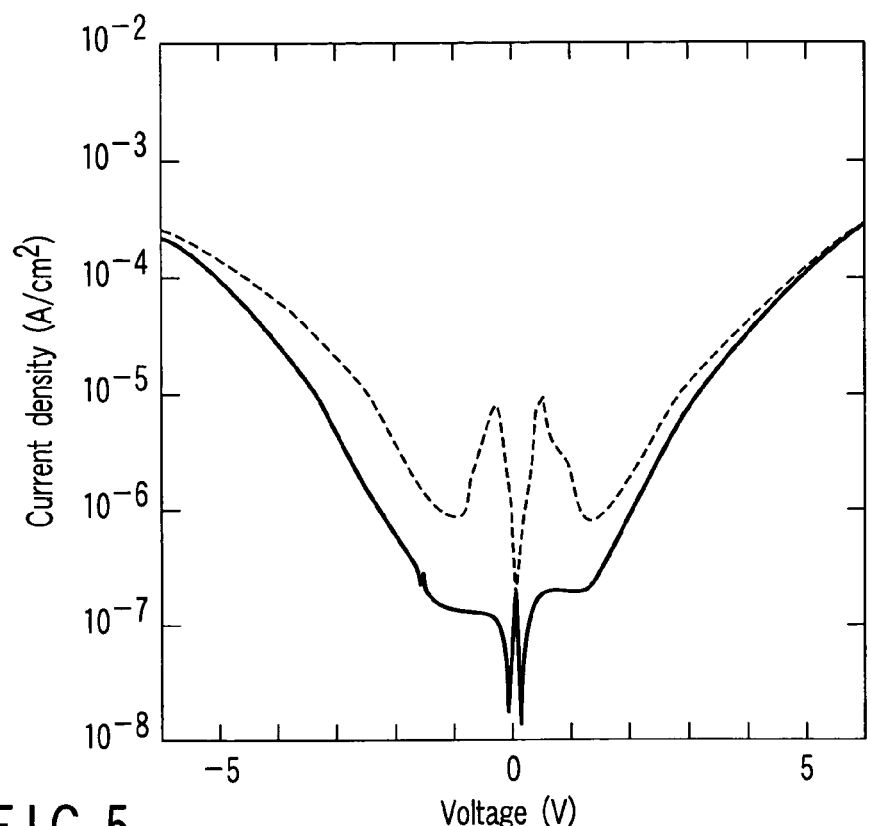
FIG. 5 is a graph illustrating the leak current of the sample according to the embodiment.

FIG. 5 illustrates the leak current of the same sample. The leak current at 1.5V was in the order of $10^{-7}$ $A/cm^2$, which is sufficiently low as shown in the figure. The fatigue characteristics were measured and the results indicated that the fatigue did not develop even after $10^8$ times of write-in and read-out.

Figure 6:
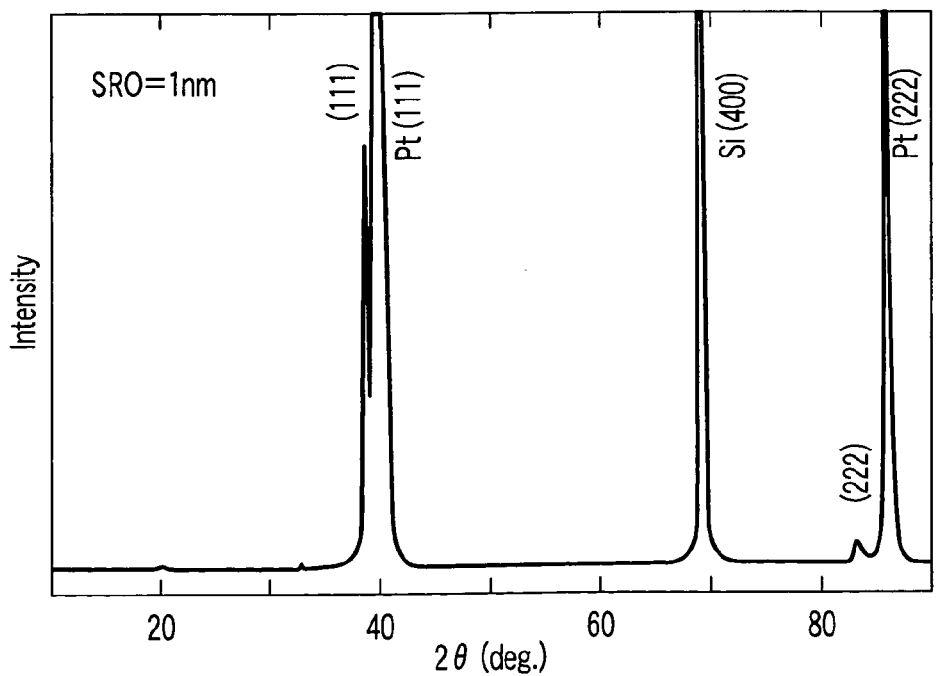
FIG. 6 is a diagram illustrating the X-ray diffraction pattern of PZT of the sample according to the embodiment.

The X-ray diffraction pattern of the crystal structure of the ferroelectric layer (PZT) of this sample is shown in FIG. 6. As is clearly shown, the PZT film formed on the thin lower SRO film of 1 nm had a strong priority orientation in the (111) direction.

Figure 7:
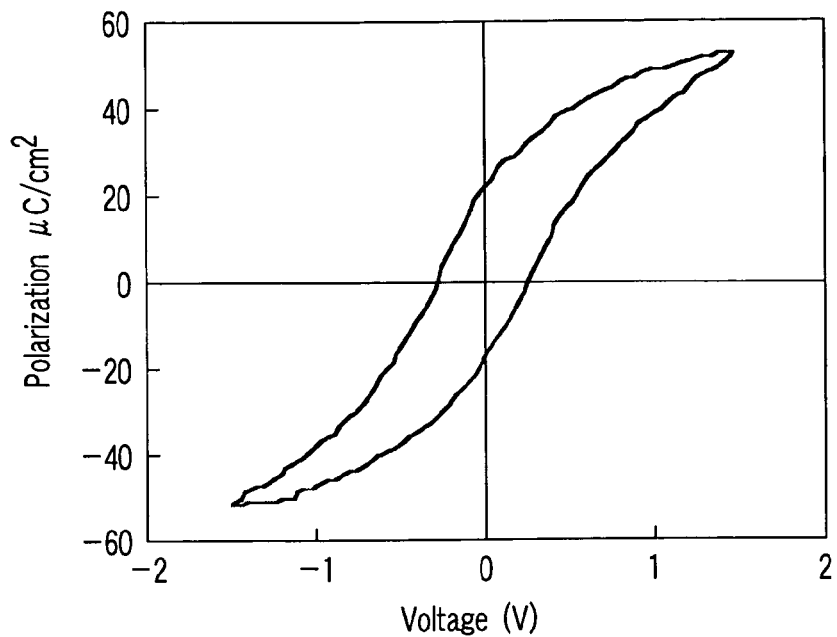
FIG. 7 is a graph illustrating the electrical characteristics of a conventional sample.

The sample with the thick lower SRO film of 10 nm is equivalent to the case of the conventional structure, and as shown in FIG. 2, the Qsw of this sample was as low as about 20 $\mu C/cm^2$. This sample with the conventional structure was measured in terms of the ferroelectric hysteresis characteristics at 1.5V, and the result was shown in FIG. 7. As compared to FIG. 3, the hysteresis curve shown in this figure, has a lying down shape, from which it is understood that this sample is inferior to the size of the signal amount.

Figure 8:
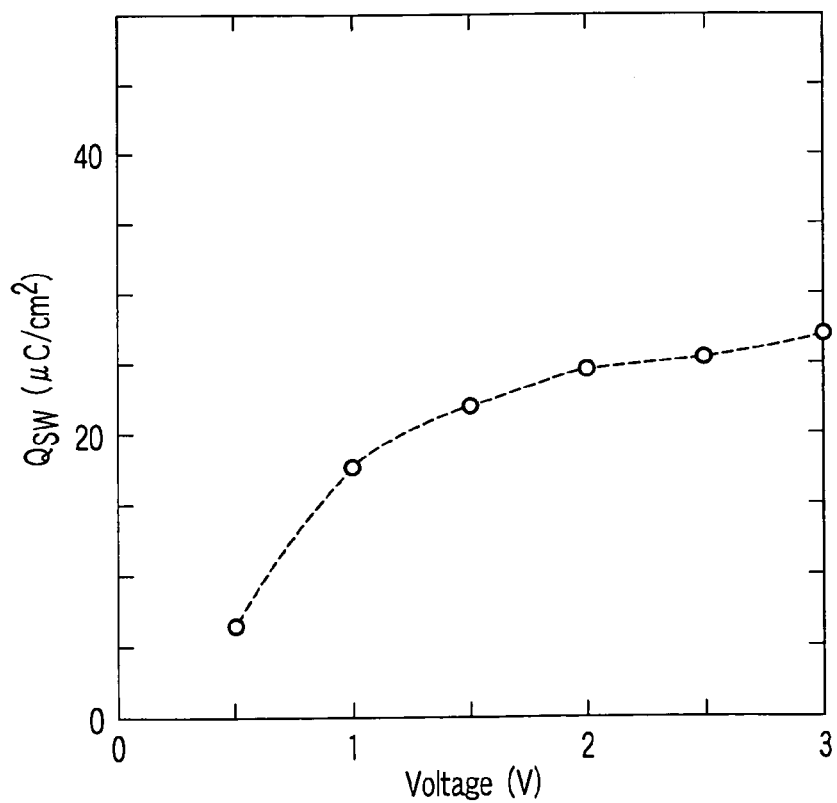
FIG. 8 is a graph illustrating the saturation characteristics of the conventional sample.
Figure 9:
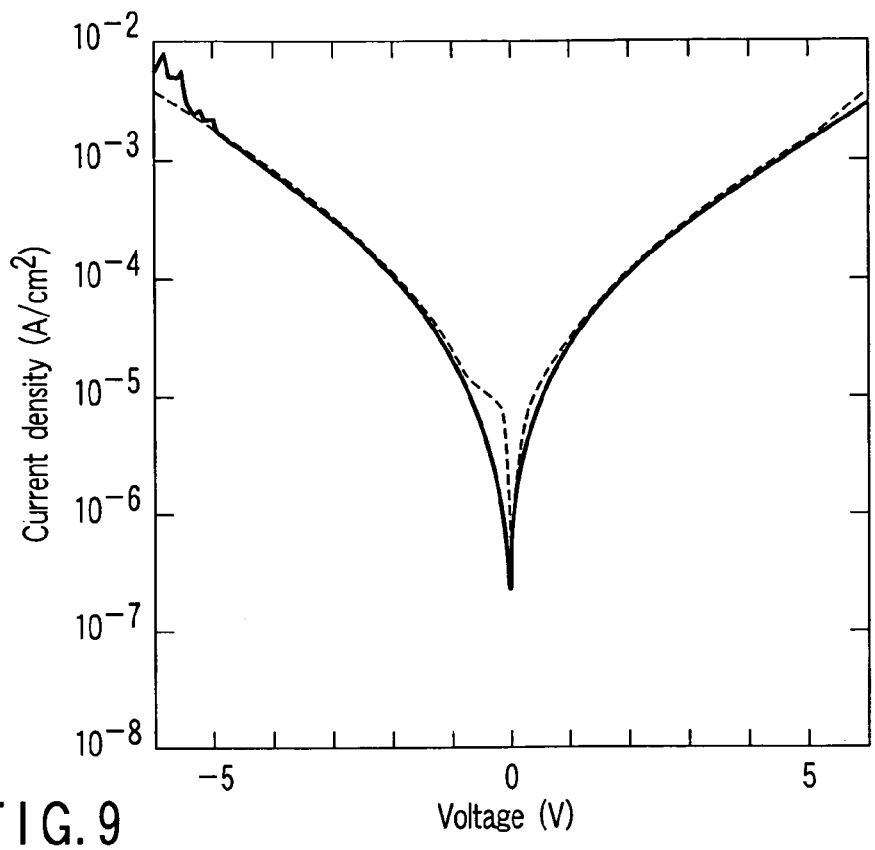
FIG. 9 is a graph illustrating the leak current of the conventional sample.
Figure 10:
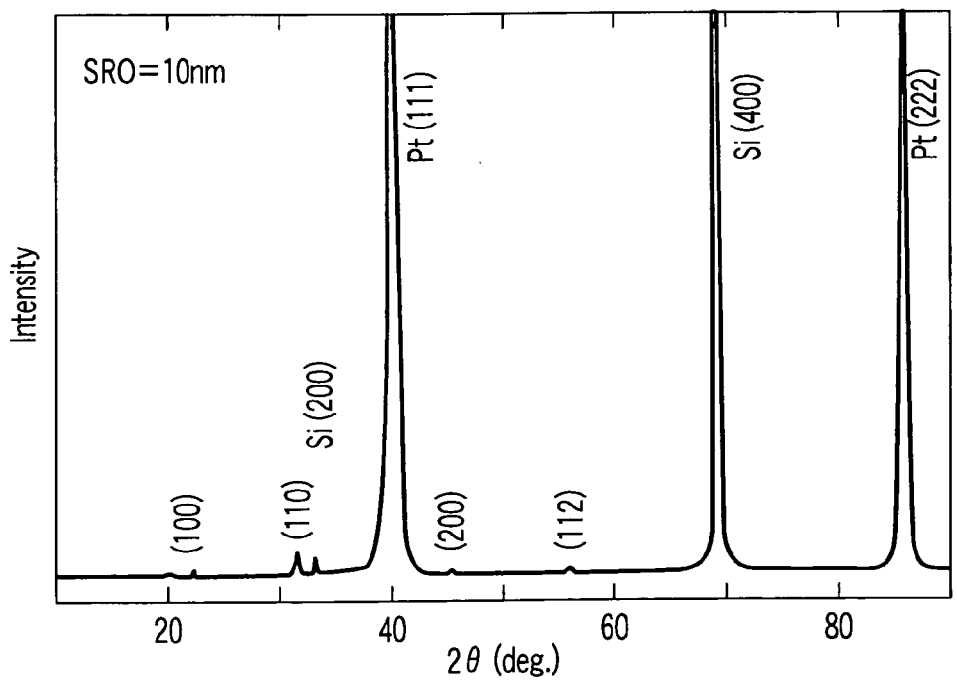
FIG. 10 is a diagram illustrating the X-ray diffraction pattern of PZT of the conventional sample.

The saturation curve and leak current of this sample of the conventional structure are shown in FIGS. 8 and 9, respectively. As shown in FIG. 8, the saturation curve indicates a saturation state at a low voltage of 2V or less, whereas its Qsw values stayed at about 20 $\mu C/cm^2$. Further, as shown in FIG. 9, the leak current at 1.5V was in the order of $10^{-5}$ $A/cm^2$. As can be understood from comparison with FIG. 5, the leak current of this sample is larger than the case of the sample of the embodiment of the present invention (the thickness of the lower SRO film: 1 nm) even by two orders of magnitude. Further, it has been confirmed that the crystal structure of PZT of this sample has a random orientation as shown in FIG. 10 and its peak strength is small.

Next, the optimal thickness of the SRO film will now be described. As described above, in the embodiment of the present invention, the characteristics of the ferroelectric material have been successfully improved by setting the thickness of the SRO film to 2 nm or less. The leak current is dependent on the thickness of the SRO film, and it becomes smaller, as the SRO film is thinner. Therefore, the SRO film should be as thin as possible. Further, it has been made clear that even if the film is as thin as about 1 nm, it raises no significant problem in terms of the fatigue characteristics as long as the SRO film is used in the lower electrode. It should be pointed out here that when the film is used as a ferroelectric memory or piezoelectric element, generally, as the polarization amount is larger, a larger signal amount can be obtained. However, when the polarization amount is extremely large, the device is, in some cases, damaged due to the distortion of the crystals. For this reason, it is desirable that the polarization amount should be adjusted appropriately in accordance with the purpose. According to the present invention, the thickness of the SRO film can be adjusted to 2 nm or less in accordance with the purpose, and therefore it is possible to construct the optimal device for its usage.

Examples of the ferroelectric memory to which the embodiment of the present invention can be applied are a chain FeRAM, and those having structures of COP type and offset type, etc.

The chain FeRAM is a TC parallel unit serial connection type ferroelectric memory having a structure in which both ends of a capacitor (C) are connected to the source and drain of a cell transistor (T) to form a unit cell, and a plurality of such unit cells are connected in series.

The COP type memory has such a structure in which a plug made of raw materials of W or Si is formed on an active region of the transistor, and a capacitor is arranged directly on the plug. With this type, the cell area can be reduced, and therefore it is very advantageous in terms of high integration, although the type entails such drawbacks that the plug is oxidized when forming the ferroelectric film, thereby increasing the contact resistance, and the film is peeled off.

The offset type memory has such a structure in which after formation of the capacitor, the upper electrode and the active region of the transistor are connected to each other by a plug. With this type, although it is not easy to reduce the cell area to achieve a high integration, the type is advantageous because the plug is not affected by the heat treatment carried out for forming the ferroelectric film, thereby making it possible to reduce the load on the production process.

As described above, according to the embodiment of the present invention, there is provided a semiconductor device that includes a ferroelectric device having a large polarization amount and excellent fatigue characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate; and
    a ferroelectric layer provided above the semiconductor substrate and sandwiched between a lower electrode and an upper electrode, the lower electrode comprising a strontium ruthenate film having a thickness of 2 nm or less.

2. The semiconductor device according to claim 1, wherein the strontium ruthenate film is crystalline.

3. The semiconductor device according to claim 1, wherein the lower electrode has a Pt film on the semiconductor substrate side.

4. The semiconductor device according to claim 1, wherein a thickness of the strontium ruthenate film in the lower electrode is 0.5 nm or more and 1.5 nm or less.

5. The semiconductor device according to claim 1, wherein the ferroelectric layer is a thin film comprising lead zirconate titanate.

6. The semiconductor device according to claim 5, wherein the lead zirconate titanate thin film has a priority orientation in a direction of (111).

7. The semiconductor device according to claim 6, wherein the strontium ruthenate film is crystalline.

8. The semiconductor device according to claim 5, wherein the strontium ruthenate film is crystalline.

9. The semiconductor device according to claim 5, wherein the lower electrode has a Pt film on the semiconductor substrate side.

10. The semiconductor device according to claim 5, wherein a thickness of the strontium ruthenate film in the lower electrode is 0.5 nm or more and 1.5 nm or less.

11. The semiconductor device according to claim 1, wherein the upper electrode has a strontium ruthenate film formed in contact with the ferroelectric layer.

12. The semiconductor device according to claim 11, wherein the upper electrode has a Pt film above the strontium ruthenate film.

13. A method for manufacturing a semiconductor device, comprising:
    forming an amorphous strontium ruthenate film having a thickness of 2 nm or less above a semiconductor substrate;
    forming a lower electrode by crystallizing the amorphous strontium ruthenate film by a heat treatment;
    forming a ferroelectric layer above the lower electrode; and
    forming an upper electrode above the ferroelectric layer.

14. The method according to claim 13, wherein a thickness of the amorphous strontium ruthenate film is 0.5 nm or more and 1.5 nm or less.

15. The method according to claim 13, wherein the ferroelectric layer is a thin film comprising lead zirconate titanate.

16. The method according to claim 15, wherein the lead zirconate titanate thin film has a priority orientation in a direction of (111).

17. The method according to claim 13, further comprising: forming a Pt film above the semiconductor substrate before forming the amorphous strontium ruthenate film.

18. The method according to claim 13, wherein the heat treatment is carried out by RTA in an oxygen gas flow, at 600° C. and for 30 seconds.

19. The method according to claim 13, wherein the upper electrode is formed by depositing a strontium ruthenate film.

20. The method according to claim 19, further comprising depositing a Pt film above the ferroelectric layer before depositing the strontium ruthenate film.

* * * * *